(12) United States Patent
Yagi et al.

(10) Patent No.: US 11,776,787 B2
(45) Date of Patent: Oct. 3, 2023

(54) CHARGED PARTICLE BEAM APPARATUS

(71) Applicant: JEOL Ltd., Tokyo (JP)

(72) Inventors: Kazuki Yagi, Tokyo (JP); Yusuke Toriumi, Tokyo (JP)

(73) Assignee: JEOL Ltd., Tokyo (JP)

(*) Notice: Subject to any disclaimer, the term of this patent is extended or adjusted under 35 U.S.C. 154(b) by 39 days.

(21) Appl. No.: 17/570,043

(22) Filed: Jan. 6, 2022

(65) Prior Publication Data
US 2022/0216033 A1 Jul. 7, 2022

(30) Foreign Application Priority Data

Jan. 7, 2021 (JP) ................................ 2021-001502

(51) Int. Cl.
| | | |
|---|---|---|
| *H01J 37/28* | (2006.01) | |
| *H01J 37/20* | (2006.01) | |
| *H01J 37/244* | (2006.01) | |
| *H01J 37/26* | (2006.01) | |

(52) U.S. Cl.
CPC .............. *H01J 37/28* (2013.01); *H01J 37/20* (2013.01); *H01J 37/244* (2013.01); *H01J 37/265* (2013.01); *H01J 2237/20207* (2013.01)

(58) Field of Classification Search
CPC .. H01J 37/00; H01J 37/02; H01J 37/26; H01J 37/28; H01J 37/20; H01J 37/244; H01J 37/265; H01J 37/228; H01J 2237/20207; H01J 2237/2802; H01J 2237/2808; H01J 2237/24415; H01J 2237/2445; H01J 2237/248

USPC ......................................... 250/306, 307, 311
See application file for complete search history.

(56) References Cited

U.S. PATENT DOCUMENTS

| | | |
|---|---|---|
| 2016/0079031 A1 | 3/2016 | Aoyama |
| 2019/0115187 A1* | 4/2019 | Kawai ..................... H01J 37/10 |

FOREIGN PATENT DOCUMENTS

| | | |
|---|---|---|
| JP | 201651576 A | 4/2016 |
| JP | 201672005 A | 5/2016 |

OTHER PUBLICATIONS

Extended European Search Report issued in EP21217377.7 dated May 31, 2022.

(Continued)

*Primary Examiner* — Jason L McCormack
(74) *Attorney, Agent, or Firm* — THE WEBB LAW FIRM

(57) ABSTRACT

A charged particle beam apparatus includes a tilt mechanism that tilts a specimen, a detector that detects an electromagnetic wave emitted from the specimen, a table storage unit that stores a table in which tilt angle information on a tilt angle of the specimen and detection solid-angle information on the detection solid angle of the detector are associated with each other, a tilt control unit that controls the tilt mechanism, and a detection-solid-angle information acquisition unit that acquires the tilt angle information from the tilt control unit and acquires the detection solid-angle information with reference to the table.

8 Claims, 17 Drawing Sheets

(56) References Cited

OTHER PUBLICATIONS

Kraxner et al., Quantitative EDXS: Influence of geometry on a four detector system, Ultramicroscopy, Oct. 18, 2016, vol. 172, pp. 30-39.
Xu et al., A numerical model for multiple detector energy dispersive X-ray spectroscopy in the transmission electron microscope, Ultramicroscopy, vol. 164, 2016, pp. 51-61.
Yeoh et al., The Dark Side of EDX Tomography: Modeling Detector Shadowing to Aid 3D Elemental Signal Analysis, Microscopy and Microanalysis, 2015, pp. 759-764.
Office Action issued in JP2021001502 dated Jan. 31, 2023.

* cited by examiner

CHARGED PARTICLE BEAM APPARATUS

CROSS-REFERENCE TO RELATED APPLICATION

This application claims priority to Japanese Patent Application No. 2021-001502 filed Jan. 7, 2021, the disclosure of which is hereby incorporated by reference in its entirety.

BACKGROUND OF THE INVENTION

Field of the Invention

The present invention relates to a charged particle beam apparatus.

Description of Related Art

An energy-dispersive X-ray spectrometer is known as an elemental analyzer to be installed in a scanning electron microscope or a transmission electron microscope.

When an X-ray generated on a specimen is detected in an electron microscope including an energy-dispersive X-ray spectrometer, an X-ray detector is disposed near the specimen. Such an energy-dispersive X-ray spectrometer is disclosed in JP-A-2016-72005.

In an electron microscope, a specimen stage has a tilt mechanism for tilting a specimen. For example, when a crystalline specimen is observed at a high magnification in a transmission electron microscope, the specimen is tilted to observe a crystal lattice, and a specific crystal orientation is adjusted to the incident direction of an electron beam.

However, when the specimen is tilted, an X-ray generated on the specimen may be blocked by a member disposed near the specimen of a specimen holder or the like, allowing the X-ray to reach only a part of the detection surface of an X-ray detector. This reduces the detection solid angle of the X-ray detector, resulting in low detection efficiency. The detection efficiency means the ratio of X-rays detected to be signals with respect to X-rays emitted from a specimen.

In an electron microscope, the determination of the detection solid angle of a detector enables a measurement in an optimum state with high detection efficiency.

SUMMARY OF THE INVENTION

According to an aspect of the invention, there is provided a charged particle beam apparatus including:
  a tilt mechanism that tilts a specimen;
  a detector that detects an electromagnetic wave emitted from the specimen;
  a table storage unit that stores a table in which tilt angle information on the tilt angle of the specimen and detection solid-angle information on the detection solid angle of the detector are associated with each other;
  a tilt control unit that controls the tilt mechanism; and
  a detection-solid-angle information acquisition unit that acquires the tilt angle information from the tilt control unit and acquires the detection solid-angle information with reference to the table.

DESCRIPTION OF THE INVENTION

According to an embodiment of the invention, there is provided a charged particle beam apparatus including:
  a tilt mechanism that tilts a specimen;
  a detector that detects an electromagnetic wave emitted from the specimen;
  a table storage unit that stores a table in which tilt angle information on the tilt angle of the specimen and detection solid-angle information on the detection solid angle of the detector are associated with each other;
  a tilt control unit that controls the tilt mechanism; and
  a detection-solid-angle information acquisition unit that acquires the tilt angle information from the tilt control unit and acquires the detection solid-angle information with reference to the table.

In such a charged particle beam apparatus, the detection-solid-angle information acquisition unit acquires the detection solid-angle information from the tilt angle information with reference to the table, thereby easily determining the detection solid angle.

Preferred embodiments of the invention are specifically described in detail below with reference to the drawings. It is noted that the following embodiments do not unduly limit the scope of the invention as stated in the claims. In addition, all of the components described in the following embodiments are not necessarily essential requirements of the invention.

In the following example, a charged particle beam apparatus according to the embodiments of the invention is a transmission electron microscope that generates X-rays by emitting electron beams to a specimen. The charged particle beam apparatus according to the invention may be an apparatus that generates X-rays by emitting charged particle beams (e.g., ion beams) other than electron beams to a specimen. Alternatively, the charged particle beam apparatus according to the invention may be an apparatus that generates electromagnetic waves (e.g., cathode luminescence) other than X-rays by emitting electron beams to a specimen.

1. First Embodiment

1.1. Electron Microscope

Figure 1:
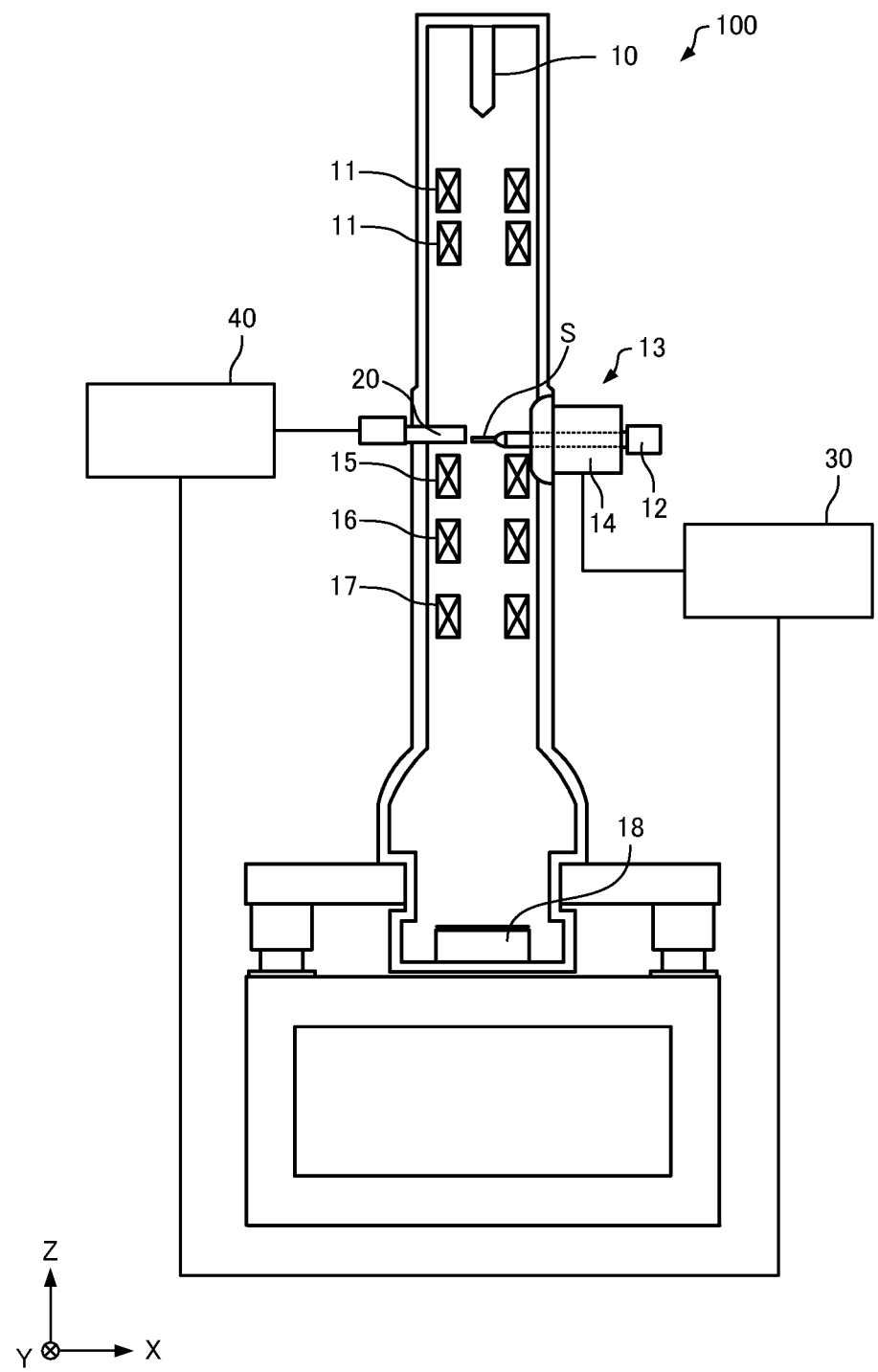
FIG. 1 illustrates a configuration of an electron microscope according to the first embodiment.

An electron microscope according to a first embodiment will be first described below with reference to the accompanying drawings. FIG. 1 illustrates the configuration of an electron microscope 100 according to the first embodiment. For convenience, FIG. 1 illustrates X axis, Y axis, and Z axis as three axes orthogonal to one another.

The electron microscope 100 includes an electron source 10, illumination-system lenses 11, a specimen holder 12, a specimen stage 14, an objective lens 15, an intermediate lens 16, a projector lens 17, an imaging device 18, an X-ray detector 20, a tilt control unit 30, and a detector control unit 40. The electron microscope 100 is a transmission electron microscope.

The electron source 10 generates electron beams. The electron source 10 is an electron gun for accelerating electrons, which are emitted from a cathode, at an anode and emitting electron beams.

The illumination-system lenses 11 are lenses for focusing an electron beam generated by the electron source 10 and irradiating a specimen S with the electron beam.

The specimen holder 12 holds the specimen S. The specimen holder 12 can be attached to the specimen stage 14. The specimen stage 14 positions the specimen S held by the specimen holder 12. In the illustrated example, the specimen stage 14 is a side-entry stage that inserts the specimen S from the side of the pole piece of the objective lens 15.

The electron microscope 100 includes a tilt mechanism 13 for tilting the specimen S. The tilt mechanism 13 includes an X tilt mechanism for tilting the specimen S in X direction and a Y tilt mechanism for tilting the specimen S in Y direction. Specifically, the specimen stage 14 includes an X tilt mechanism for tilting the specimen S in X direction. Furthermore, the specimen holder 12 includes a Y tilt mechanism for tilting the specimen S in Y direction. In this way, the specimen S can be tilted in two directions (X direction and Y direction) orthogonal to each other in the electron microscope 100. The configuration of the tilt mechanism 13 is not particularly limited.

The objective lens 15 is a first-stage lens for forming a transmission-electron-microscope image (TEM image) with an electron beam having passed through the specimen S. The objective lens 15 has a pole piece, which is not illustrated. A magnetic field is generated between the upper pole of the pole piece and the lower pole of the pole piece and focuses an electron beam.

The intermediate lens 16 and the projector lens 17 further enlarge the TEM image formed by the objective lens 15 and form the enlarged image on the imaging device 18. The objective lens 15, the intermediate lens 16, and the projector lens 17 constitute an image-forming system in the electron microscope 100.

The imaging device 18 captures the TEM image formed by the image-forming system. The imaging device 18 is a digital camera, for example, a CCD (Charge Coupled Device) camera or a CMOS (Complementary MOS) camera.

The X-ray detector 20 detects a characteristic X-ray that is emitted from the specimen S by irradiating the specimen S with an electron beam. The X-ray detector 20 can be, for example, a silicon drift detector (SDD) or a Si (Li) detector. The X-ray detector 20 is disposed near the specimen S when an X-ray is detected.

The tilt control unit 30 controls the tilt mechanism 13. The tilt control unit 30 controls the X tilt mechanism of the specimen stage 14 and the Y tilt mechanism of the specimen holder 12. For example, the tilt control unit 30 controls the tilt mechanism 13 to perform processing for tilting the specimen S. The tilt control unit 30 includes an input receiving unit for receiving an input of tilt angle information on the tilt angle of the specimen S. The tilt angle of the specimen S is the angle of specimen S with respect to a horizontal plane. The functions of the input receiving unit can be implemented by, for example, a keyboard, a mouse, a button, a touch panel, and a touch pad.

The tilt control unit 30 sends the tilt angle information on the tilt angle of the specimen S to the detector control unit 40. The tilt control unit 30 sends the tilt angle information to the detector control unit 40, so that the tilt angle information can be shared by the tilt control unit 30 and the detector control unit 40.

The tilt angle information includes information on the tilt angle of the specimen S in X direction and information on the tilt angle of the specimen S in Y direction. The tilt angle information is information for specifying the tilt angle of the specimen S.

The tilt control unit 30 includes, for example, a central processing unit (CPU) and storage devices (random access memory (RAM) and read only memory (ROM)). In the tilt control unit 30, programs stored in the storage device are executed by hardware such as a CPU, so that various kinds of calculation and various kinds of control are performed.

The detector control unit 40 controls the X-ray detector 20. Moreover, the detector control unit 40 generates analysis data based on an X-ray detection result in the X-ray detector 20. The analysis data includes spectrum data and mapping data.

Figure 2:
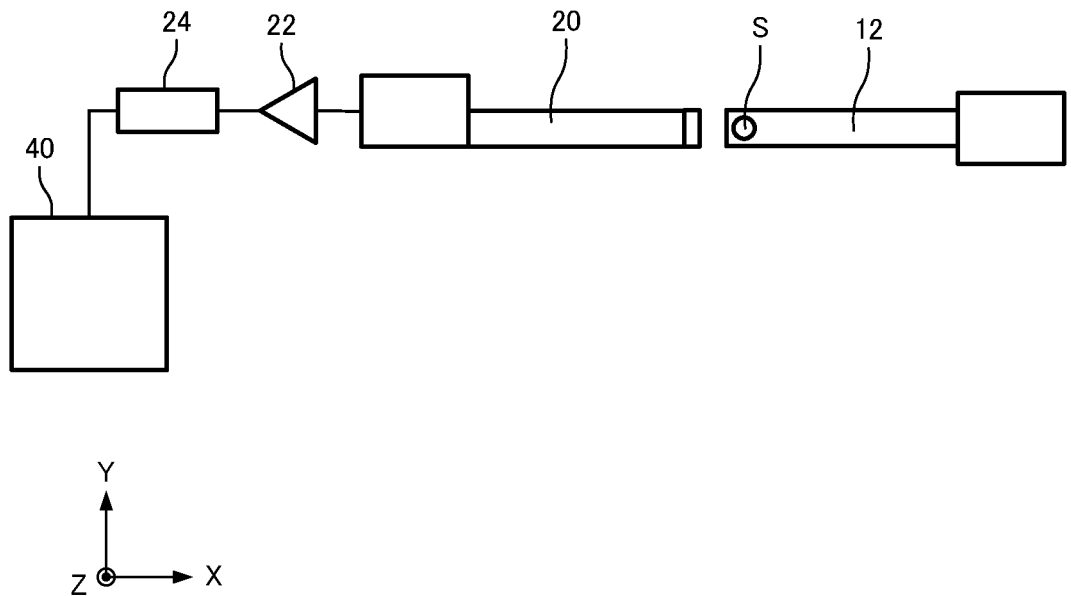
FIG. 2 is a diagram for describing an X-ray detector.

FIG. 2 is a diagram for describing the X-ray detector 20.

When an X-ray enters the X-ray detector 20, a charge is generated according to the energy of the X-ray in the X-ray detector 20. The charge is converted into a voltage by a field-effect transistor in the X-ray detector 20. A signal (pulse signal) outputted from the X-ray detector 20 is amplified by a proportional amplifier 22 and is counted for each peak value by a multichannel pulse height analyzer 24. The detector control unit 40 generates, based on the number of pulses for each peak value, spectrum data on spectrums indicated by X-ray energy plotted on the horizontal axis and the number of X-ray counts (intensity) plotted on the vertical axis.

Figure 3:
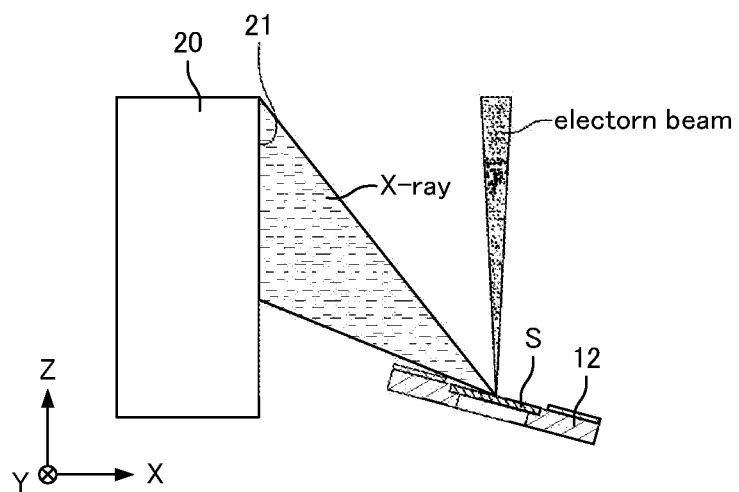
FIG. 3 is a diagram for describing a positional relationship between an X-ray detector and a specimen.

FIG. 3 is a diagram for describing a positional relationship between the X-ray detector 20 and the specimen S.

As illustrated in FIG. 3, in the electron microscope 100, the X-ray detector 20 is disposed on the side of the specimen S when an X-ray generated on the specimen S is detected. In the illustrated example, the X-ray detector 20 is disposed in −X direction when viewed from the specimen S. As described above, the electron microscope 100 includes the tilt mechanism 13 capable of tilting the specimen S. In the illustrated example, the specimen S is tilted in X direction by using the X tilt mechanism.

In this configuration, when the specimen S is tilted, an X-ray emitted from the specimen S may be blocked by a member disposed near the specimen S. In the example of FIG. 3, the X-ray emitted from the specimen S is partially blocked by the specimen holder 12. Hence, the X-ray enters only a part of a detection surface 21 of the X-ray detector 20. This reduces the detection solid angle of the X-ray detector 20. In this case, the detection solid angle means a solid angle from the incident point of an electron beam on the specimen S to the detection surface 21 of the X-ray detector 20. The detection solid angle can be increased with the effective detection area of the detection surface 21. The larger the detection solid angle, the higher the detection efficiency.

Figure 4:
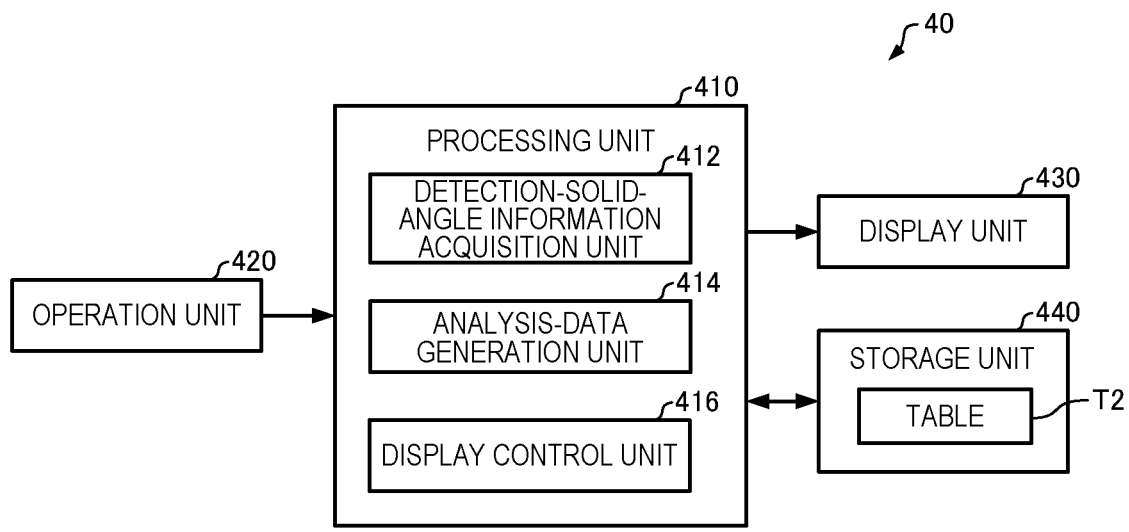
FIG. 4 illustrates a configuration of a detector control unit.

FIG. 4 illustrates a configuration of the detector control unit 40.

As illustrated in FIG. 4, the detector control unit 40 includes a processing unit 410, an operation unit 420, a display unit 430, and a storage unit 440.

The operation unit 420 is provided for a user input of operation information. The inputted operation information is outputted to the processing unit 410. The functions of the operation unit 420 can be implemented by hardware such as a keyboard, a mouse, a button, a touch panel, and a touch pad.

The display unit 430 displays an image generated by the processing unit 410. The functions of the display unit 430 can be implemented by, for example, liquid crystal display (LCD), a cathode ray tube (CRT), and a touch panel also acting as the operation unit 420.

The storage unit 440 stores programs and various kinds of data that are provided for causing a computer to act as the units of the processing unit 410. The storage unit 440 also acts as a work area of the processing unit 410. The functions of the storage unit 440 can be implemented by, for example, a hard disk and RAM.

The processing unit 410 controls the X-ray detector 20. The functions of the processing unit 410 can be implemented by executing programs by means of hardware including various processors (e.g., a CPU). The processing unit 410 includes a detection-solid-angle information acquisition unit 412, an analysis-data generation unit 414, and a display control unit 416.

The detection-solid-angle information acquisition unit 412 acquires tilt angle information from the tilt control unit 30 and acquires detection solid-angle information with reference to a table in which the tilt angle information and the detection solid-angle information are associated with each other.

Figure 5:
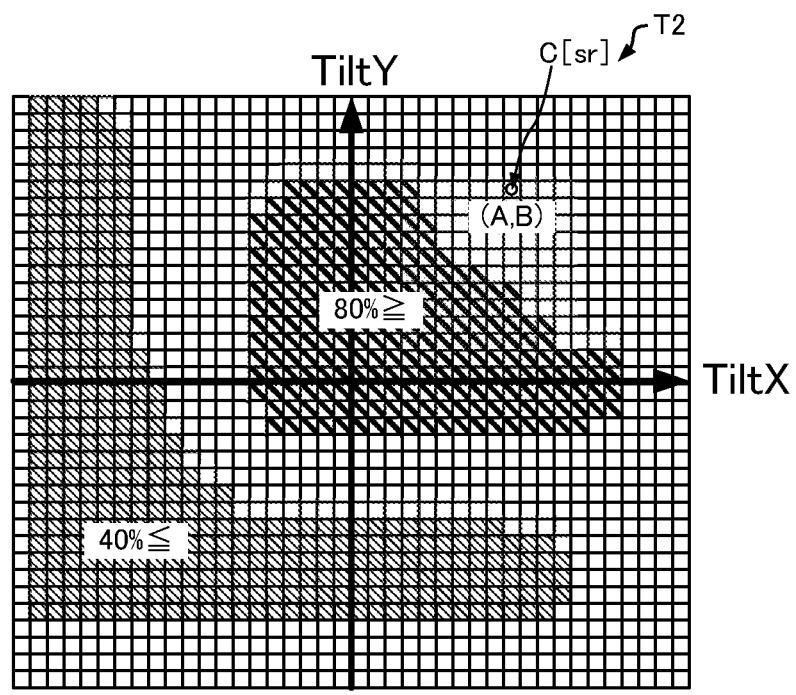
FIG. 5 illustrates a table in which tilt angle information and detection solid-angle information are associated with each other.

FIG. 5 illustrates a table T2 in which the tilt angle information and the detection solid-angle information are associated with each other.

The horizontal axis of the table T2 in FIG. 5 indicates tilt angle information (TiltX) in X direction while the vertical axis indicates tilt angle information (TiltY) in Y direction. In the illustrated example, TiltX denotes the tilt angle [°] of the specimen S in X direction and TiltY denotes the tilt angle [°] of the specimen S in Y direction. Coordinates (TiltX,TiltY)=(0,0) indicate that the specimen S has a tilt angle of 0° in X direction and a tilt angle of 0° in Y direction. In other words, the coordinates (TiltX,TiltY)=(0,0) indicate that the specimen S is horizontal.

At coordinates (TiltX,TiltY) of the table T2, detection solid-angle information corresponding to tilt angle information expressed by the coordinates is stored.

For example, a tilt angle of A[°] in X direction and a tilt angle of B[°] in Y direction can be expressed as coordinates (TiltX,TiltY)=(A,B). At coordinates (A,B) of the table T2, C[sr] is stored as detection solid-angle information. Thus, the detection solid-angle information C[sr] can be acquired from the tilt angle information (A,B) with reference to the table T2.

In the table T2 of FIG. 5, hatching is performed at coordinates where a ratio $\Omega/\Omega_{max}$ is at least 80% and coordinates where a ratio $\Omega/\Omega_{max}$ is 40% or less where $\Omega$ is a detection solid angle, and $\Omega_{max}$ is a maximum detection solid angle obtained by the X-ray detector 20.

The table T2 can be created by, for example, generating the model of the electron microscope 100 with three-dimensional CAD and calculating a detection solid angle by using the model. A detection solid angle is calculated for each of tilt angles that can be formed by the X tilt mechanism and the Y tilt mechanism, so that the table T2 can be created.

The table T2, C[sr] is stored in the storage unit 440. In other words, the storage unit 440 acts as a table storage unit where the table T2 is stored.

The analysis-data generation unit 414 generates analysis data based on an X-ray detection result in the X-ray detector 20. The analysis-data generation unit 414 generates, for example, spectrum data and mapping data. The mapping data includes element mapping data about the distribution of elements on the specimen and spectrum mapping data in which a position and a spectrum on the specimen are associated with each other.

The analysis-data generation unit 414 stores the generated analysis data in the storage unit 440. At this point, the analysis-data generation unit 414 stores the analysis data in association with measurement conditions. The measurement conditions include the detection solid-angle information. The analysis-data generation unit 414 acquires the detection solid-angle information from the detection-solid-angle information acquisition unit 412 and stores the acquired detection solid-angle information in the storage unit 440 in association with the analysis data.

The storage unit 440 acts as an analysis-data storage unit which stores measurement condition information in association with the analysis data.

In the electron microscope 100, the single storage device acts as the analysis-data storage unit and the table storage unit. The analysis-data storage unit and the table storage unit may be implemented by different storage devices.

The display control unit 416 causes the display unit 430 to display an image based on the detection solid-angle information. The image based on the detection solid-angle information includes numbers, symbols, figures, and graphs. Moreover, the display control unit 416 causes the display unit 430 to display an image based on the analysis data. The image based on the analysis data includes spectrums and maps.

Figure 6:
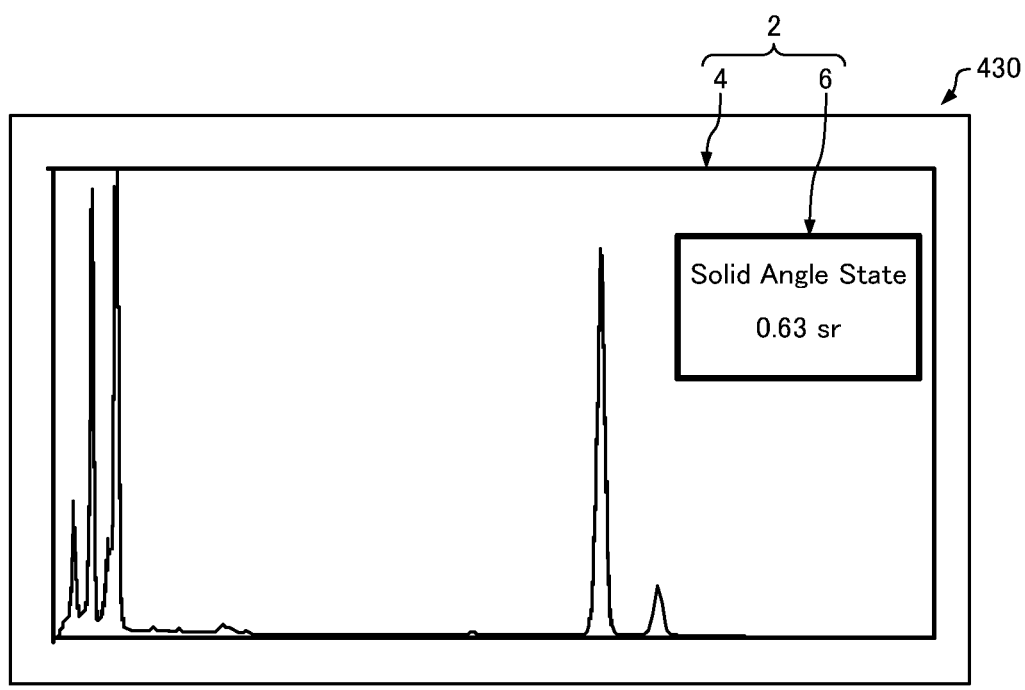
FIG. 6 schematically illustrates an analysis screen.

FIG. 6 schematically illustrates an analysis screen 2.

The display control unit 416 causes the display unit 430 to display the analysis screen 2. The analysis screen 2 includes an analysis-result display area 4 and a detection solid-angle display area 6. In the analysis-result display area 4, an image based on the analysis data is displayed. In the illustrated example, a spectrum is displayed as an image based on the analysis data. In the detection solid-angle display area 6, an image based on the detection solid-angle information is displayed. In the illustrated example, a numeric value indicating a detection solid angle is displayed as an image based on the detection solid-angle information. As illustrated in FIG. 6, an image displayed based on the detection solid-angle information on the display unit 430 enables a user to easily determine a detection solid angle.

1.2. Operation

The operations of the electron microscope 100 will be described below. In the electron microscope 100, the detection solid angle changes in response to a change of the tilt angle of the specimen S. Thus, when the tilt angle of the specimen S is changed, an image for indicating a detection solid angle corresponding to the changed tilt angle is displayed on the display unit 430 in the electron microscope 100. The display processing that causes the display unit 430 to display an image for indicating a detection solid angle will be described below.

Figure 7:
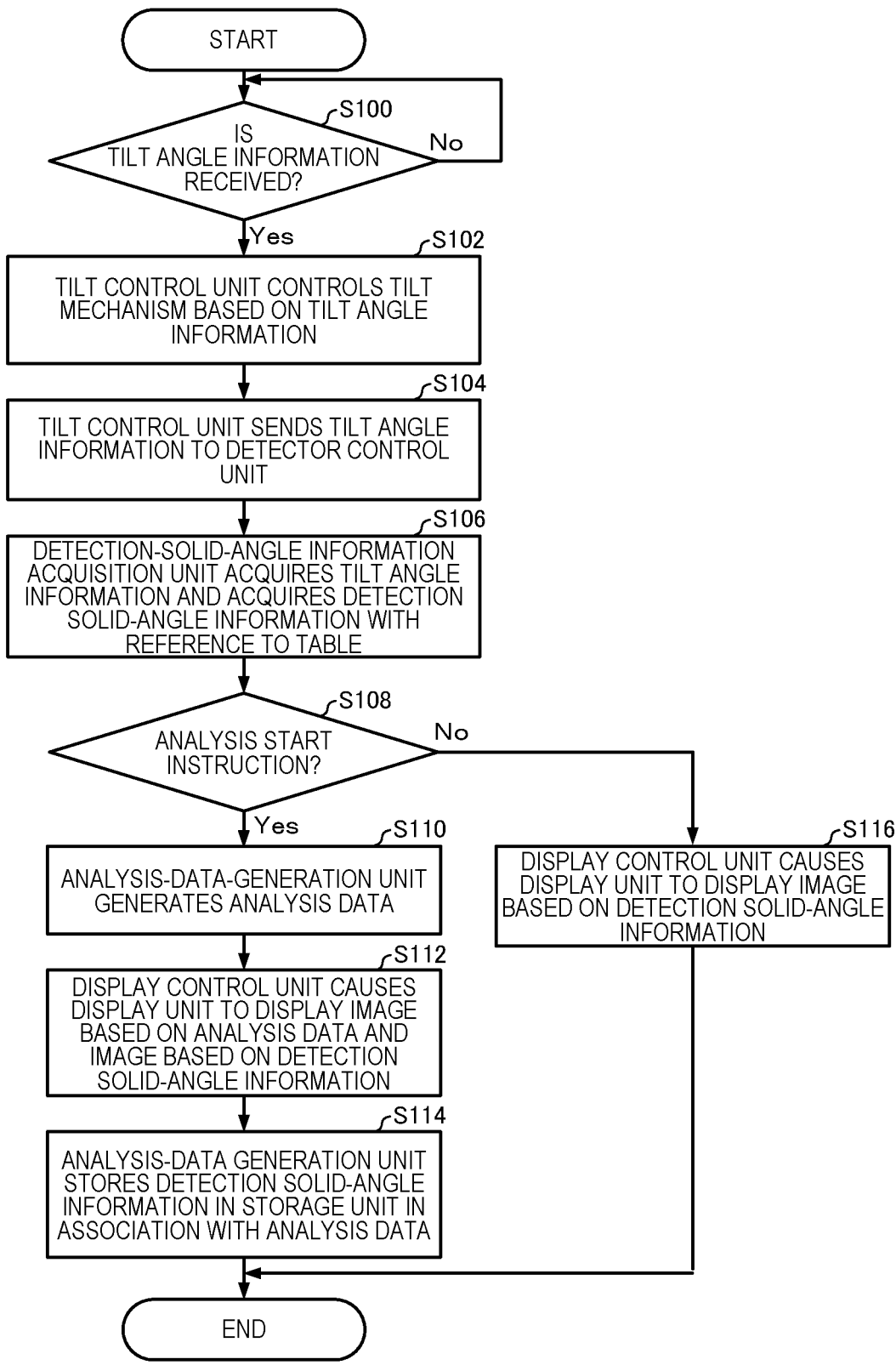
FIG. 7 is a flowchart illustrating an example of display processing.

FIG. 7 is a flowchart illustrating an example of display processing in the electron microscope 100.

In the electron microscope 100, when a user operates the input receiving unit of the tilt control unit 30 to input the tilt angle information on the specimen S, the input receiving unit receives the tilt angle information (Yes at S100).

The tilt control unit 30 controls the tilt mechanism 13 based on the inputted tilt angle information (S102). The tilt control unit 30 acquires tilt angle information in X direction (TiltX) and tilt angle information in Y direction (TiltY) from the tilt angle information, operates the X tilt mechanism based on the tilt angle information in X direction, and operates the Y tilt mechanism based on the tilt angle information in Y direction. Thus, the tilt angle of the specimen S reaches a tilt angle corresponding to the inputted tilt angle information.

The tilt control unit 30 then sends the tilt angle information to the detector control unit 40 (S104). Thus, the tilt angle information on the current tilt angle of the specimen S can be shared in the tilt control unit 30 and the detector control unit 40. The tilt angle information may be sent before the control of the tilt mechanism 13 (S102) or concurrently with the control of the tilt mechanism 13 (S102).

The detection-solid-angle information acquisition unit 412 acquires tilt angle information from the tilt control unit 30 and acquires detection solid-angle information with reference to the table T2 (S106).

The analysis-data generation unit 414 determines whether the user has provided an instruction to start measurement (start instruction) (S108). For example, when a start instruction is inputted from the operation unit 420, it is determined that the start instruction has been provided.

If it is determined that the start instruction has been provided (Yes at S108), the analysis-data generation unit 414 generates analysis data based on an X-ray detection result in the X-ray detector 20 (S110). As illustrated in FIG. 6, the display control unit 416 causes the display unit 430 to display an image based on the analysis data and an image based on the detection solid-angle information (S112). Thus, as illustrated in FIG. 6, the display unit 430 displays an image indicating the analysis data and an image indicating the detection solid angle of the X-ray detector 20 during measurement.

The analysis-data generation unit 414 stores the detection solid-angle information in the storage unit 440 in association with the analysis data (S114).

If it is determined that a start instruction has not been provided (No at S108), the display control unit 416 causes the display unit 430 to display an image based on the detection solid-angle information (S116). Thus, the display unit 430 displays an image indicating the current detection solid angle of the X-ray detector 20. After processing S114 or processing S116, the electron microscope 100 terminates the display processing.

1.3. Operation/Working-Effect

The electron microscope 100 includes the storage unit 440 that stores the table T2 in which the tilt angle information on the tilt angle of the specimen S and the detection solid-angle information on the detection solid angle of the X-ray detector 20 are associated with each other, the tilt control unit 30 for controlling the tilt mechanism 13, and the detection-solid-angle information acquisition unit 412 that acquires the tilt angle information from the tilt control unit 30 and acquires the detection solid-angle information with reference to the table T2. As described above, in the electron microscope 100, the detection-solid-angle information acquisition unit 412 acquires the detection solid-angle information from the tilt angle information with reference to the table T2, thereby easily determining the detection solid angle.

In the electron microscope 100, the analysis-data generation unit 414 acquires the detection solid-angle information from the detection-solid-angle information acquisition unit 412 and stores the acquired detection solid-angle information in the storage unit 440 in association with the analysis data. In this way, in the electron microscope 100, the detection solid-angle information is stored in the storage unit 440 in association with the analysis data, enabling analysis in consideration of the detection solid angle. For example, in the case of a quantitative analysis with an acquired spectrum, a detection solid angle can be taken into consideration. This can increase the quantitative accuracy.

The electron microscope 100 includes the display control unit 416 that causes the display unit 430 to display an image based on the detection solid-angle information. Thus, the electron microscope 100 allows the user to easily determine the detection solid angle. Hence, even in the case of analyses on multiple specimens S, detection solid angles can be analyzed under the same conditions in the electron microscope 100.

1.4. Modification

A modification of the electron microscope according to the first embodiment will be described below. Differences from the example of the electron microscope 100 will be described below and an explanation of similar points is omitted.

1.4.1. First Modification

Figure 8:
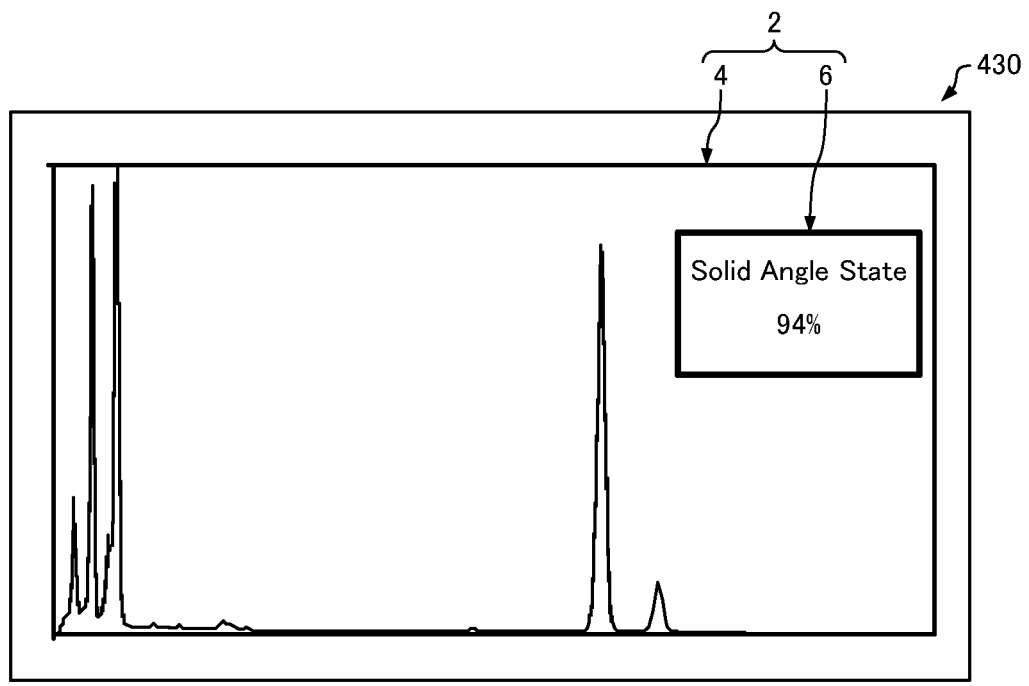
FIG. 8 schematically illustrates a modification of an analysis screen.
Figure 9:
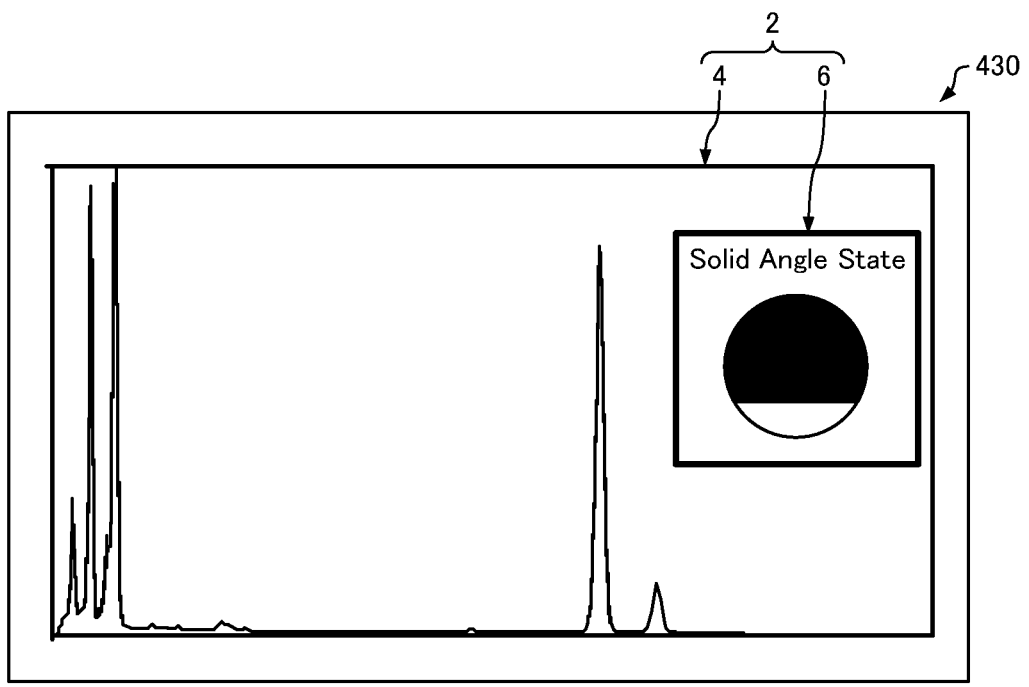
FIG. 9 schematically illustrates a modification of an analysis screen.

FIGS. 8 and 9 schematically illustrate a modification of the analysis screen 2.

In the foregoing embodiment, as illustrated in FIG. 6, a numeric value indicating a detection solid angle in the detection solid-angle display area 6 is displayed as an image based on the detection solid-angle information. An image based on the detection solid-angle information is not limited thereto.

For example, as illustrated in FIG. 8, the image based on the detection solid angle may indicate a detection solid angle as a ratio $\Omega/\Omega_{max}$ (hereinafter may be simply referred to as "ratio $\Omega/\Omega_{max}$ to a maximum detection solid angle") of a detection solid angle $\Omega$ to a maximum detection solid angle $\Omega_{max}$ obtained by the X-ray detector 20. In this case, detection solid-angle information recorded at the coordinates of the table T2 in FIG. 5 may be a ratio $\Omega/\Omega_{max}$ to a maximum detection solid angle.

For example, as illustrated in FIG. 9, the image based on the detection solid angle may indicate a ratio $\Omega/\Omega_{max}$ to a maximum detection solid angle as a figure or a graph. In the illustrated example, only an area of a circle is filled according to the ratio $\Omega/\Omega_{max}$ to the maximum detection solid angle, thereby indicating the ratio $\Omega/\Omega_{max}$ to the maximum detection solid angle.

Furthermore, as an image based on the detection solid-angle information, an area actually irradiated with an X-ray and an area not irradiated with an X-ray may be displayed on a schematic image of the detection surface 21. These areas are not illustrated. This can visually identify an area actually irradiated with an X-ray on the detection surface 21.

1.4.2. Second Modification

Figure 10:
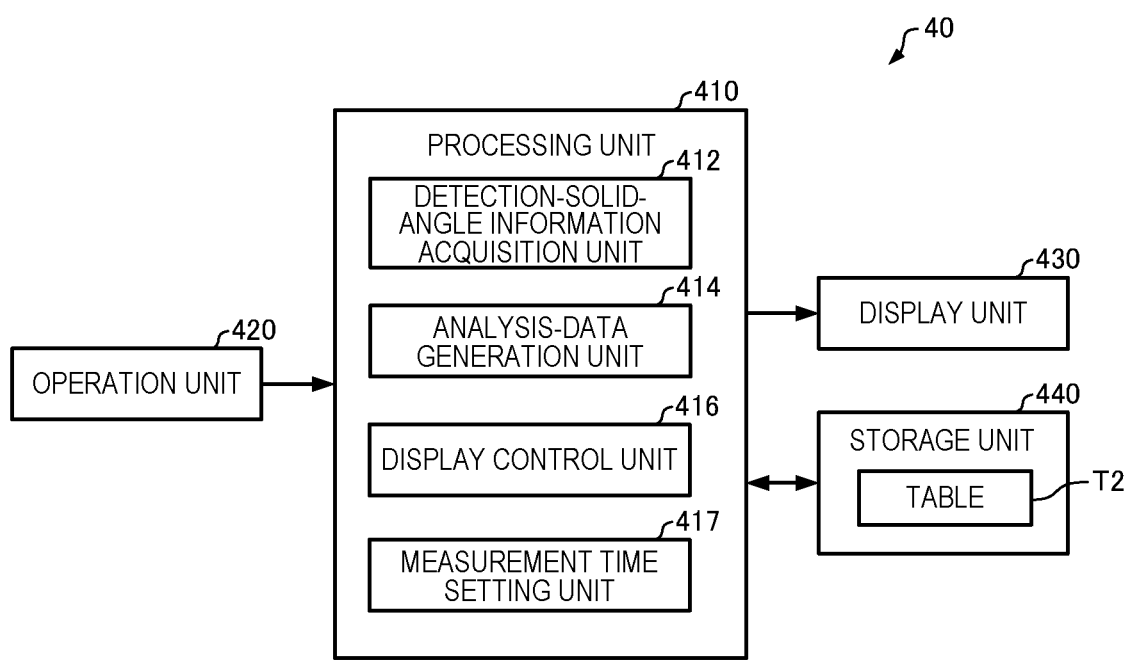
FIG. 10 is a diagram illustrating a modification of a detector control unit.

In a second modification, the electron microscope 100 sets a measurement time based on a detection solid angle such that a signal amount is kept constant in each measurement even when the detection solid angle is changed. FIG. 10 illustrates a modification of the detector control unit 40.

As illustrated in FIG. 10, in the second modification, the processing unit 410 of the detector control unit 40 includes a measurement time setting unit 417.

The measurement time setting unit 417 sets a measurement time based on a detection solid-angle information. A measurement time is a time for detecting an X-ray by the X-ray detector 20 in each measurement.

The measurement time setting unit 417 sets a measurement time based on detection solid-angle information such that a signal amount (X-ray dosage) detected by the X-ray detector 20 is kept constant in each measurement even when multiple measurements are conducted at different detection solid angles.

For example, when a ratio $\Omega/\Omega_{max}$ to a maximum detection solid angle is 100%, the measurement time setting unit 417 sets the measurement time at 2×t seconds in response to a change of the ratio $\Omega/\Omega_{max}$ to the maximum detection solid angle to 50% with a measurement time set at t seconds. This can keep a constant signal amount.

For example, when a ratio $\Omega/\Omega_{max}$ to a maximum detection solid angle is 50%, the measurement time setting unit 417 sets the measurement time at t/2 seconds in response to a change of the ratio $\Omega/\Omega_{max}$ to the maximum detection solid angle to 100% with a measurement time set at t seconds. This can keep a constant signal amount.

Figure 11:
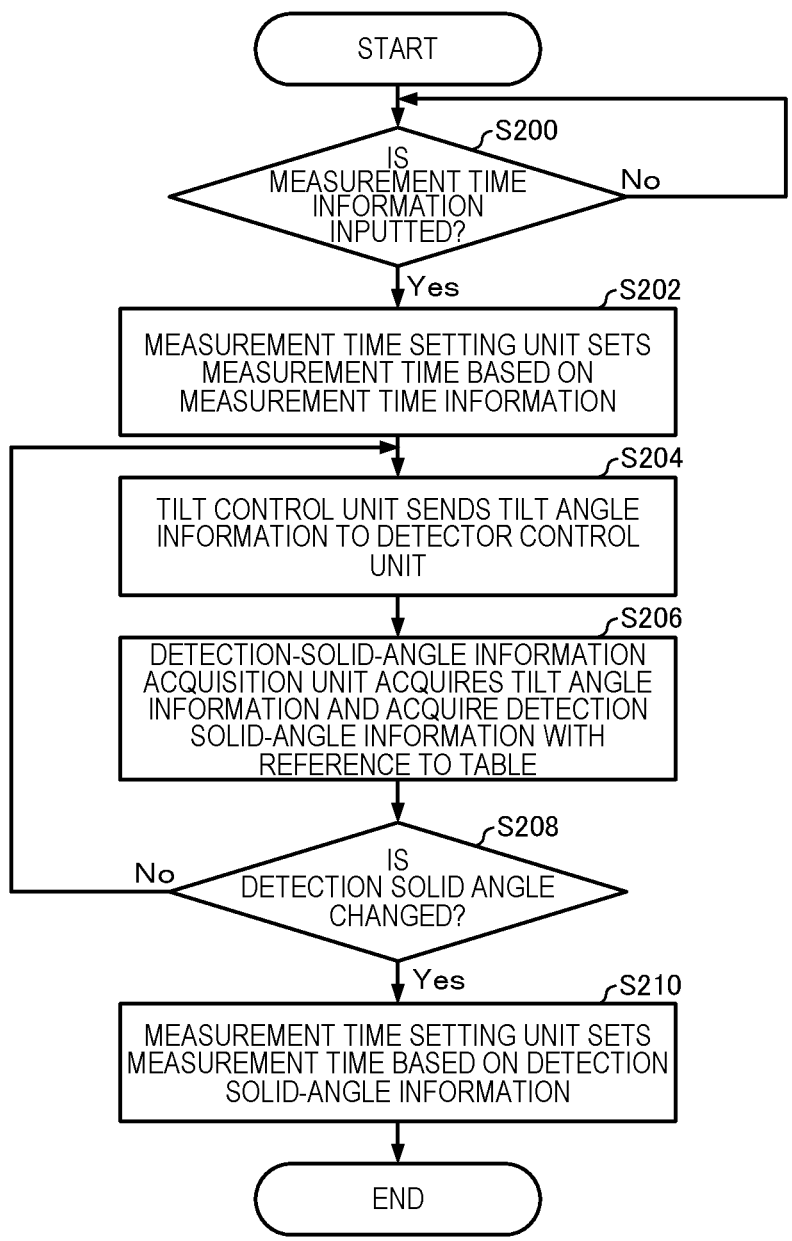
FIG. 11 is a flowchart illustrating an example of processing for setting a measurement time.

FIG. 11 is a flowchart illustrating an example of processing for setting a measurement time in the electron microscope 100.

In the electron microscope 100, when a user operates the operation unit 420 of the detector control unit 40 to input measurement time information for setting a measurement time, the operation unit 420 receives the measurement time information (Yes at S200). When receiving the measurement time information, the operation unit 420 sends the measurement time information to the processing unit 410. In this way, the operation unit 420 acts as an input receiving unit for receiving the measurement time information.

The measurement time setting unit 417 acquires the measurement time information from the operation unit 420 and sets a measurement time based on the acquired measurement time information (S202).

The tilt control unit 30 then sends tilt angle information to the detector control unit 40 (S204). Thus, current tilt angle information on the specimen S can be shared in the tilt control unit 30 and the detector control unit 40. The tilt angle information may be sent before the setting of a measurement time (S202) or concurrently with the setting of a measurement time (S202).

The detection-solid-angle information acquisition unit 412 acquires the tilt angle information from the tilt control unit 30 and acquires detection solid-angle information with reference to the table T2 (S206).

The measurement time setting unit 417 determines whether a detection solid angle has been changed, based on detection solid-angle information (S208). If the measurement time setting unit 417 determines that a detection solid angle is not changed (No at S208), the process returns to processing S204, and then the processing S204 for sending the tilt angle information by the tilt control unit 30 and the processing S206 for acquiring the tilt solid-angle information by the detection-solid-angle information acquisition unit 412 are performed. The measurement time setting unit 417 then determines whether a detection solid angle has been changed (S208). In this way, the measurement time setting unit 417 monitors a detection solid angle.

If the measurement time setting unit 417 determines that a detection solid angle has been changed (Yes at S208), a measurement time is set based on detection solid-angle information (S210).

For example, when a ratio to a maximum detection solid angle has changed from 100% to 50%, the measurement time setting unit 417 changes a measurement time from t seconds to 2× seconds. For example, when a ratio to a maximum detection solid angle has changed from 50% to 100%, the measurement time setting unit 417 changes a measurement time from t seconds to t/2 seconds. After the processing S210, the electron microscope 100 terminates the processing for setting a measurement time.

In the second modification, the electron microscope 100 includes the measurement time setting unit 417 that sets a measurement time for detecting an X-ray by the X-ray detector 20. The measurement time setting unit 417 sets a measurement time based on the detection solid-angle information. Thus, the electron microscope 100 can set uniform conditions for a signal amount detected by the X-ray detector 20 in each measurement even when multiple measurements are conducted at different detection solid angles.

1.4.3. Third Modification

Figure 12:
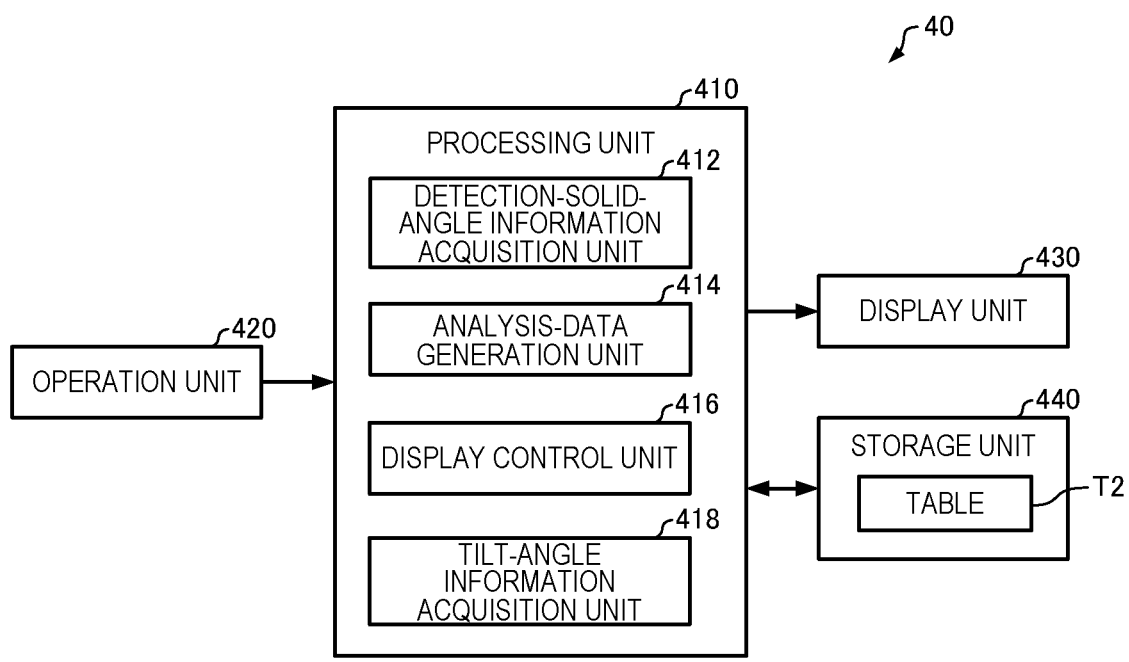
FIG. 12 is a diagram illustrating a modification of a detector control unit.

In a third modification, when a user inputs desired detection solid-angle information via the operation unit 420, the electron microscope 100 tilts the specimen S to a desired detection solid angle. FIG. 12 illustrates a modification of the detector control unit 40.

As illustrated in FIG. 12, in the third modification, the processing unit 410 of the detector control unit 40 includes a tilt-angle information acquisition unit 418.

When the user inputs detection solid-angle information via the operation unit 420, the operation unit 420 receives the detection solid-angle information and sends the information to the processing unit 410. In this way, the operation unit 420 acts as an input receiving unit for receiving the detection solid-angle information.

The tilt-angle information acquisition unit 418 acquires the detection solid-angle information from the operation unit 420 and acquires tilt angle information with reference to the table T2. For example, if C[sr] is inputted as detection solid-angle information, the tilt-angle information acquisition unit 418 searches the table T2 for coordinates where C[sr] is stored. In the table T2 of FIG. 5, C[sr] is stored at coordinates (TiltX,TiltY)=(A,B). Thus, the tilt-angle information acquisition unit 418 acquires a tilt angle of A[° ] in X direction and a tilt angle of B[° ] in Y direction as tilt angle information.

The tilt-angle information acquisition unit 418 sends the acquired tilt angle information to the tilt control unit 30. The tilt control unit 30 controls the tilt mechanism 13 based on the tilt angle information. Hence, the user can perform a measurement at a desired detection solid angle.

Figure 13:
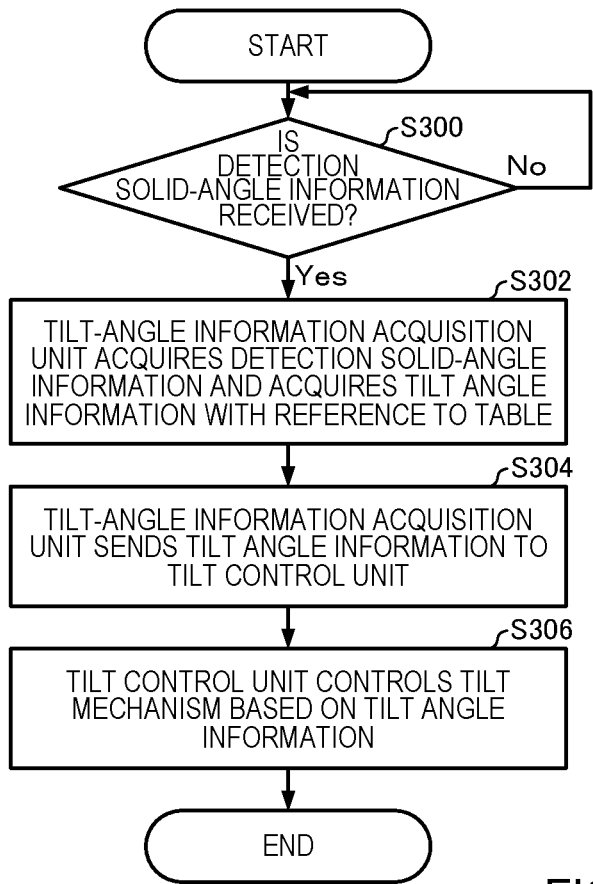
FIG. 13 is a flowchart illustrating an example of processing for setting a detection solid angle.

FIG. 13 is a flowchart illustrating an example of processing for setting a detection solid angle in the electron microscope 100.

In the electron microscope 100, when the user operates the operation unit 420 of the detector control unit 40 to input detection solid-angle information, the operation unit 420 receives the detection solid-angle information (Yes at S300). The operation unit 420 sends the detection solid-angle information to the processing unit 410.

The tilt-angle information acquisition unit 418 acquires the detection solid-angle information from the operation unit 420 and acquires tilt angle information with reference to the table T2 (S302). The tilt-angle information acquisition unit 418 sends the acquired tilt angle information to the tilt control unit 30 (S304).

The tilt control unit 30 controls the tilt mechanism 13 based on the tilt angle information (S306). Thus, the specimen S tilts, and the detection solid angle of the X-ray detector 20 reaches a detection solid angle corresponding to the inputted detection solid-angle information. After the processing S306, the electron microscope 100 terminates the processing for setting a detection solid angle.

In the third modification, the electron microscope 100 includes the operation unit 420 acting as an input receiving unit for receiving the input of the detection solid-angle information, and the tilt-angle information acquisition unit 418 that acquires the detection solid-angle information from the input receiving unit and acquires tilt angle information with reference to the table T2. The tilt control unit 30 controls the tilt mechanism 13 based on the tilt angle information. Thus, the electron microscope 100 can operate the tilt control unit 30 with a desired detection solid angle. This can automatically set the detection solid angle of the X-ray detector 20 to a desired detection solid angle in the electron microscope 100.

1.4.4. Fourth Modification

Figure 14:
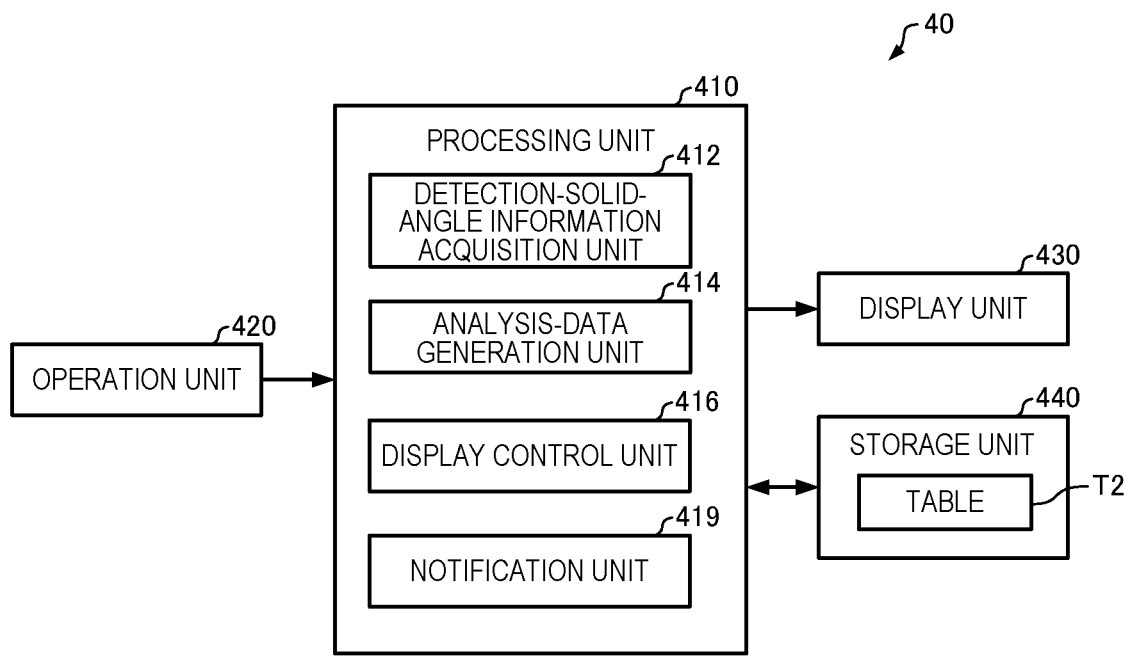
FIG. 14 is a diagram illustrating a modification of a detector control unit.

In a fourth modification, the electron microscope 100 notifies warning information when a detection solid angle is small. FIG. 14 illustrates a modification of the detector control unit 40.

As illustrated in FIG. 14, in the fourth modification, the processing unit 410 of the detector control unit 40 includes a notification unit 419.

Figure 15:
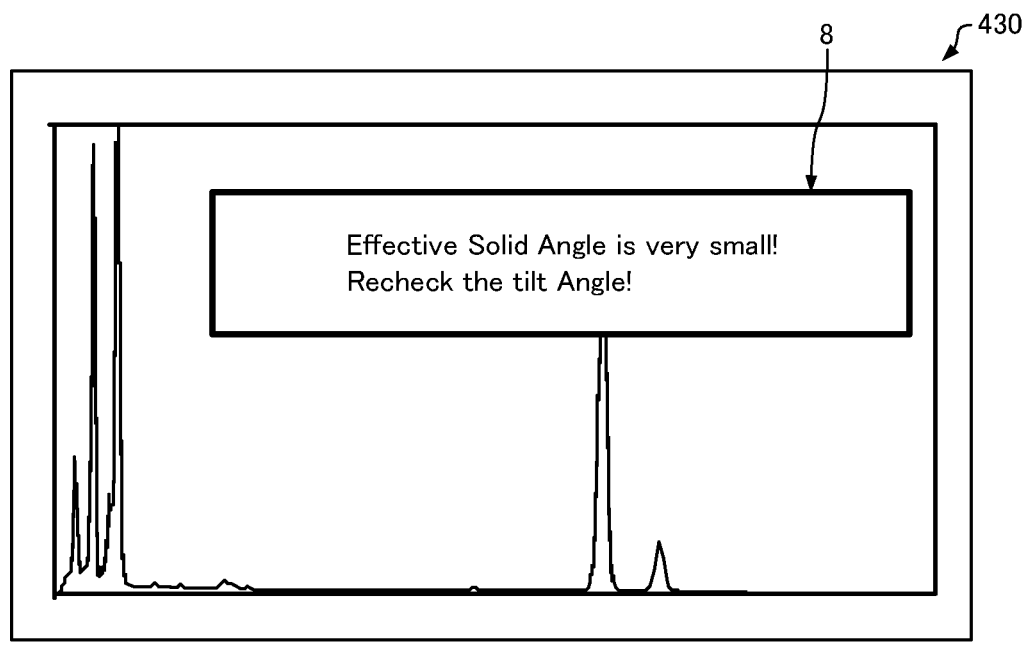
FIG. 15 illustrates an example of a notification by a notification unit.

FIG. 15 illustrates an example of a notification by the notification unit 419.

The notification unit 419 notifies warning information when a detection solid angle is smaller than a preset threshold. As indicated in FIG. 15, a notification by the notification unit 419 is a message 8 for warning of a small detection solid angle. A notification by the notification unit 419 is not limited to the display of the message 8. For example, the notification may be a notification with a beeper sound or a notification with lamplight.

Figure 16:
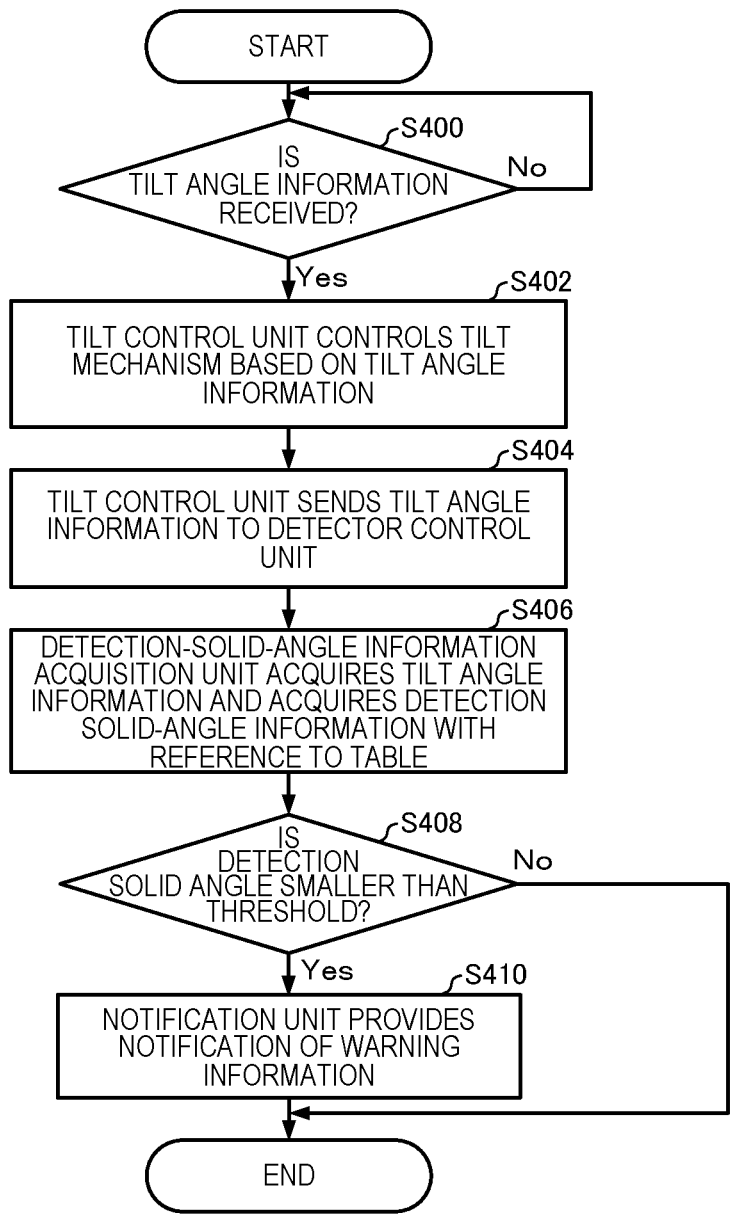
FIG. 16 is a flowchart illustrating an example of processing for a notification.

FIG. 16 is a flowchart illustrating an example of processing for a notification in the electron microscope 100.

In the electron microscope 100, when a user operates the input receiving unit of the tilt control unit 30 to input tilt angle information on the specimen S, the input receiving unit receives the tilt angle information (Yes at S400). The input receiving unit outputs the tilt angle information to the tilt control unit 30.

The tilt control unit 30 controls the tilt mechanism 13 based on the inputted tilt angle information (S402). The tilt control unit 30 sends the tilt angle information to the detector control unit 40 (S404).

The detection-solid-angle information acquisition unit 412 acquires the tilt angle information from the tilt control unit 30 and acquires detection solid-angle information with reference to the table T2 (S406).

The notification unit 419 determines whether a detection solid angle indicated by the detection solid-angle information acquired by the detection-solid-angle information acquisition unit 412 is smaller than the preset threshold (S408). If it is determined that the detection solid angle indicated by the detection-solid-angle information is smaller than the threshold (Yes at S408), the notification unit 419 notifies warning information (S410).

If it is determined that the detection solid angle is not smaller than the threshold (No at S408) or after the processing S410, the electron microscope 100 terminates the notification.

In the fourth modification, the electron microscope 100 includes the notification unit 419, allowing a user to easily determine that a detection solid angle is small.

1.4.5. Fifth Modification

Figure 17:
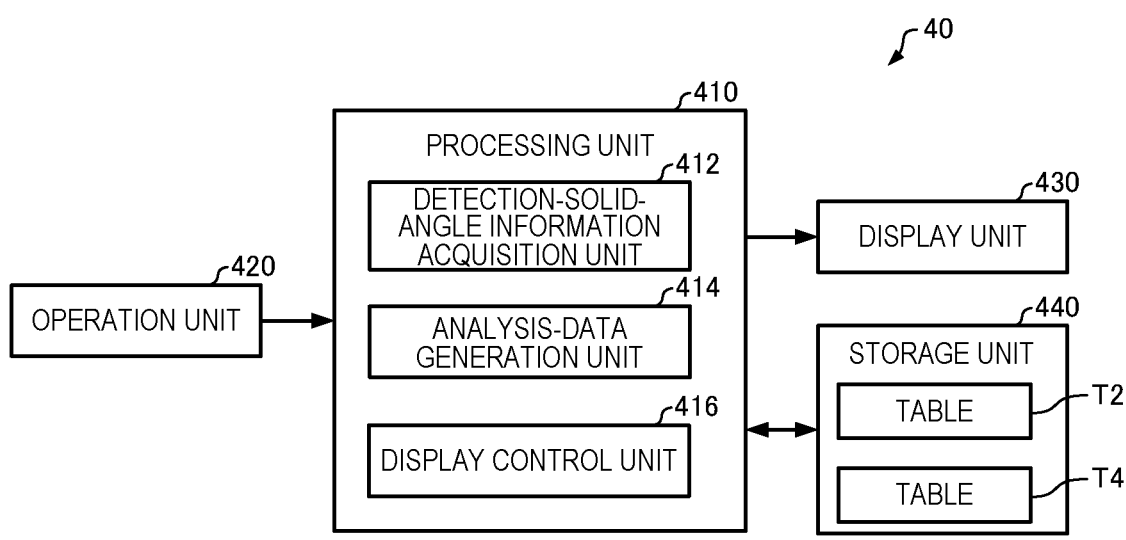
FIG. 17 is a diagram illustrating a modification of a detector control unit.

FIG. 17 illustrates a modification of the detector control unit 40.

The specimen holder 12 appears in various forms according to the purpose of observation or analysis. The relationship between tilt angle information and detection solid angle information changes depending upon the shape of the tip of the specimen holder 12.

In the fifth modification, the electron microscope 100 includes a first specimen holder and a second specimen holder as the specimen holder 12. The first specimen holder and the second specimen holder have tips in different shapes.

Moreover, the storage unit 440 stores a table T2 (an example of a first table) and a table T4 (an example of a second table). In the table T2, tilt angle information and detection solid-angle information in the first specimen holder are associated with each other. In the table T4, tilt angle information and detection solid-angle information in the second specimen holder are associated with each other.

When receiving information for specifying the kind of specimen holder, the detection-solid-angle information acquisition unit 412 determines whether to use the table T2 or the table T4 based on the information.

For example, the information for specifying the kind of specimen holder is inputted by a user via the operation unit 420, so that the information for specifying the kind of specimen holder is sent from the operation unit 420 to the processing unit 410. The information for specifying the kind of specimen holder may be acquired by reception by the detection-solid-angle information acquisition unit 412, the information being outputted from the first specimen holder and the second specimen holder.

In the foregoing description, the electron microscope 100 includes two kinds of specimen holder 12. The electron microscope 100 may include three or more kinds of specimen holder 12. In this case, the number of tables stored in the storage unit 440 increases with the number of kinds of specimen holder 12.

2. Second Embodiment

2.1. Electron Microscope

Figure 18:
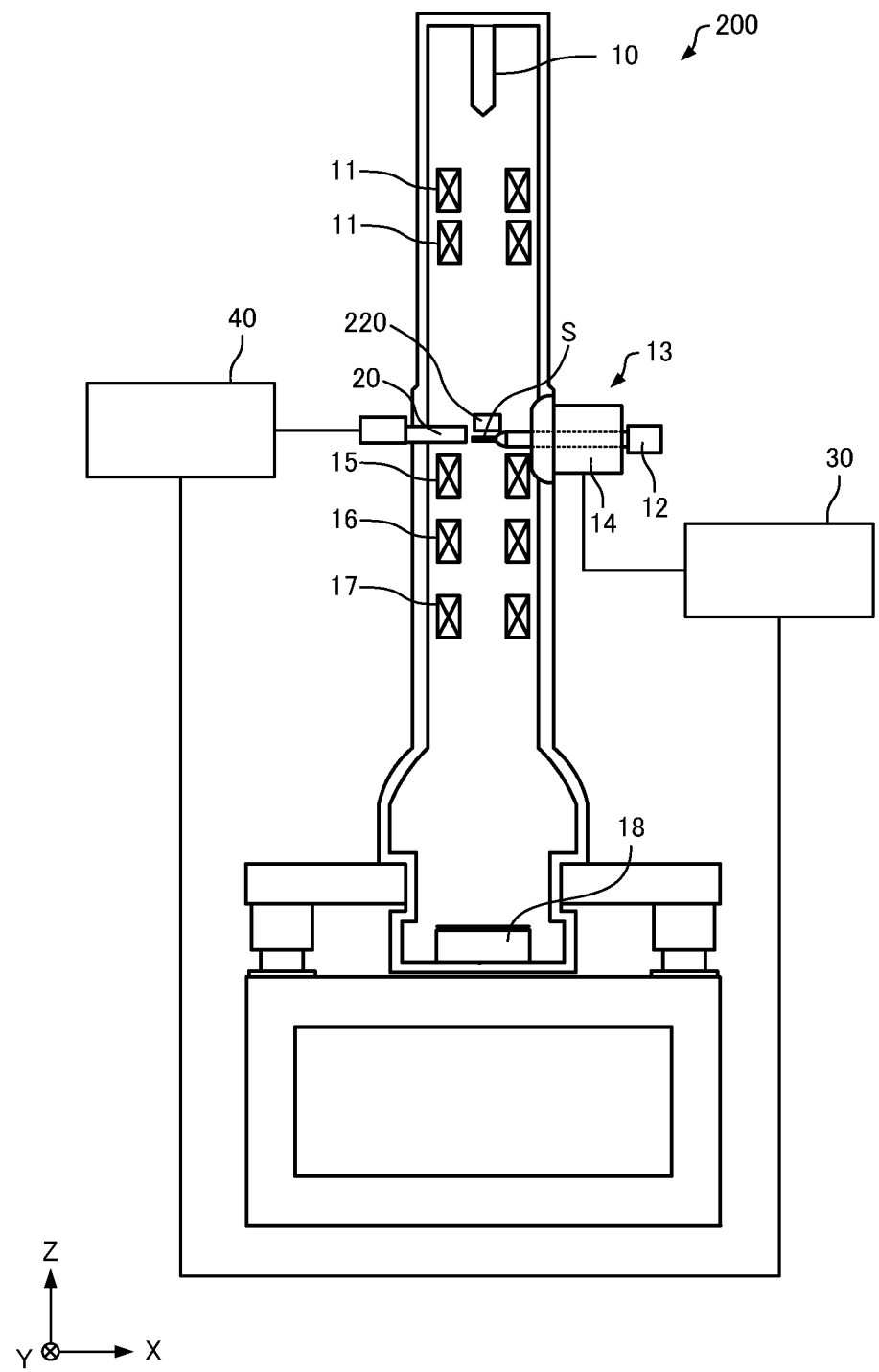
FIG. 18 illustrates a configuration of an electron microscope according to the second embodiment.
Figure 19:
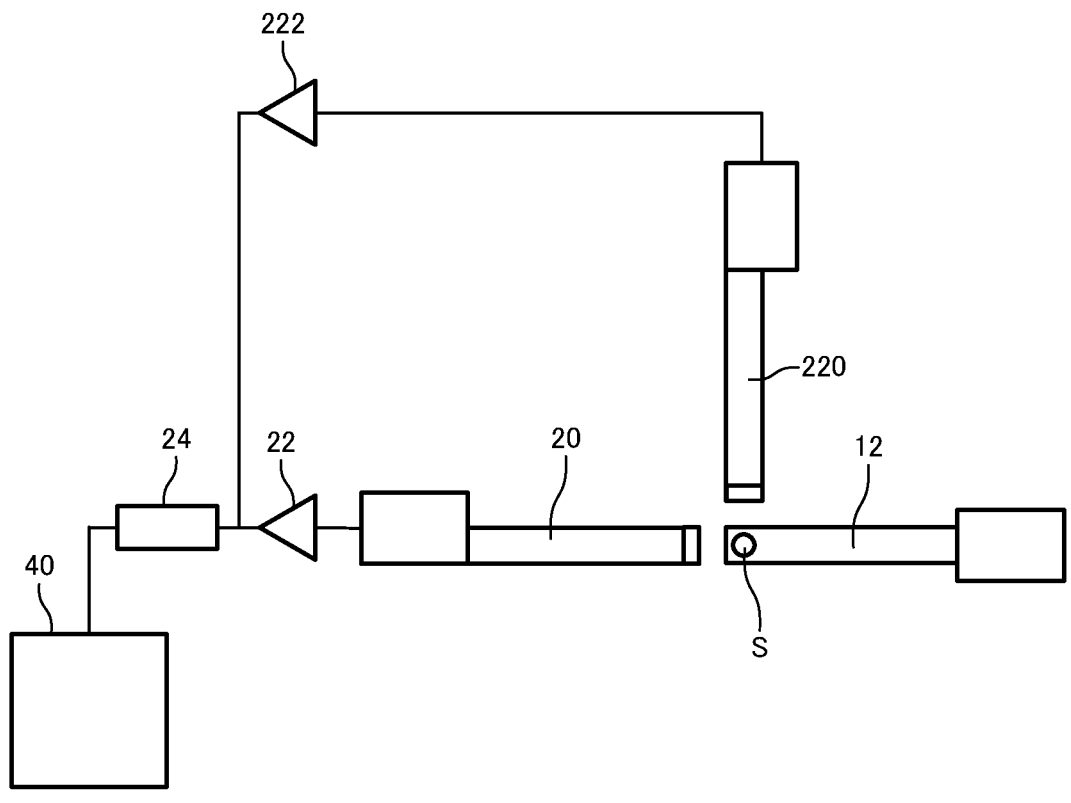
FIG. 19 illustrates a configuration of an electron microscope according to the second embodiment.
Figure 19:
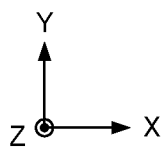

An electron microscope according to a second embodiment will be described below with reference to the accompanying drawings. FIGS. 18 and 19 illustrate configurations of an electron microscope 200 according to the second embodiment.

In the electron microscope 200 according to the second embodiment, members having the same functions as the components of the electron microscope 100 according to the first embodiment are indicated by the same reference numerals, and a detailed explanation thereof is omitted.

The electron microscope 100 includes the single X-ray detector 20 as illustrated in FIGS. 1 and 2, whereas the electron microscope 200 includes a second X-ray detector 220 in addition to an X-ray detector 20 (hereinafter also referred to as "first X-ray detector 20") as illustrated in FIGS. 18 and 19. In other words, the electron microscope 200 includes two X-ray detectors.

As illustrated in FIG. 19, when viewed from a specimen S, the first X-ray detector 20 is disposed in −X direction, whereas the second X-ray detector 220 is disposed in +Y direction.

When an X-ray enters the first X-ray detector 20, a charge is generated according to the energy of the X-ray in the first X-ray detector 20. The charge is converted into a voltage by a field-effect transistor in the X-ray detector 20. A signal (pulse signal) outputted from the first X-ray detector 20 is amplified by a proportional amplifier 22.

When an X-ray enters the second X-ray detector 220, a charge is generated according to the energy of the X-ray in the second X-ray detector 220. The charge is converted into a voltage by a field-effect transistor in the second X-ray detector 220. A signal (pulse signal) outputted from the second X-ray detector 220 is amplified by a proportional amplifier 222.

A pulse signal outputted from the first X-ray detector 20 and a pulse signal outputted from the second X-ray detector 220 are counted for each peak value by a multichannel pulse height analyzer 24. The detector control unit 40 generates, based on the number of pulses for each peak value, data on spectrums (spectrum data) indicated by X-ray energy plotted on the horizontal axis and the number of X-ray counts (intensity) plotted on the vertical axis.

The electron microscope 200 includes the first X-ray detector 20 and the second X-ray detector 220, thereby improving the detection efficiency.

Figure 20:
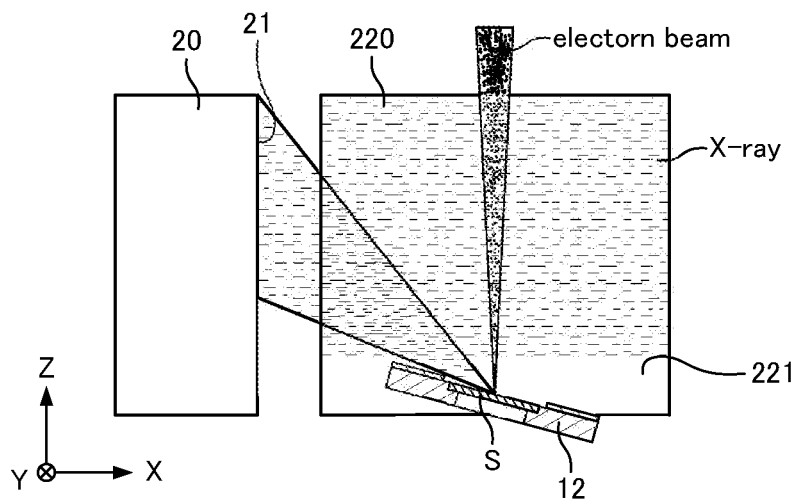
FIG. 20 is a diagram for describing a positional relationship between a first X-ray detector and a specimen and a positional relationship between a second X-ray detector and a specimen.

FIG. 20 is a diagram for describing a positional relationship between the first X-ray detector 20 and the specimen S and a positional relationship between the second X-ray detector 220 and the specimen S.

As illustrated in FIG. 20, in the electron microscope 200, the first X-ray detector 20 and the second X-ray detector 220 are disposed on the side of the specimen S when an X-ray generated on the specimen S is detected.

In this configuration, the first X-ray detector 20 and the second X-ray detector 220 are disposed at different positions. In the illustrated example, the detection surface 21 of the first X-ray detector 20 is directed in +X direction while a detection surface 221 of the second X-ray detector 220 is directed in −Y direction. The specimen S tilts in +X direction. Thus, even if the tilt angle of the specimen S remains the same, the detection solid angle of the first X-ray detector 20 and the detection solid angle of the second X-ray detector 220 are different from each other. For this reason, the relationship between a tilt angle and a detection solid angle in the first X-ray detector 20 and the relationship between a tilt angle and a detection solid angle in the second X-ray detector 220 are different from each other.

Figure 21:
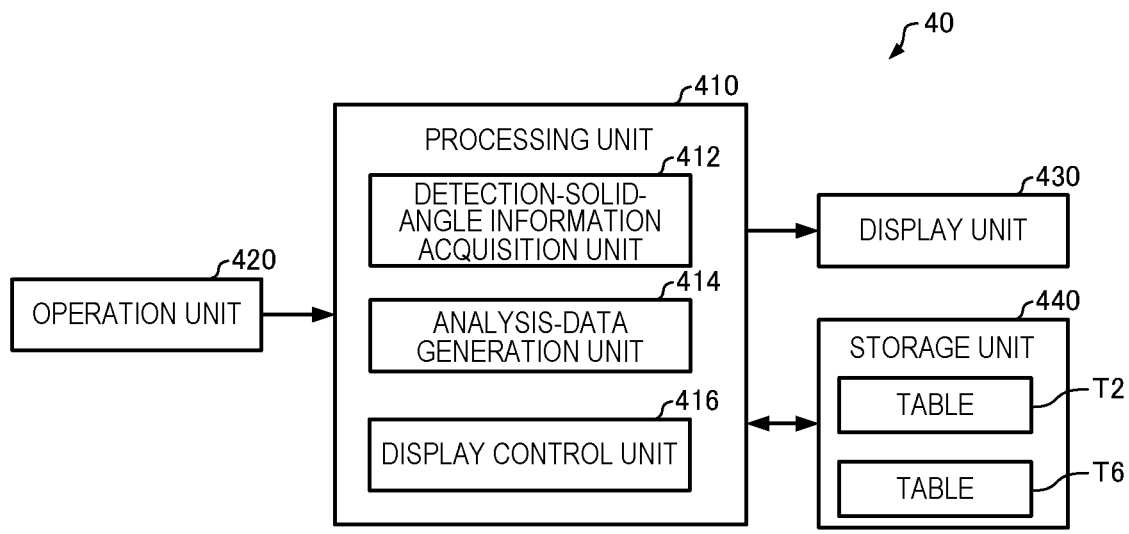
FIG. 21 is a diagram illustrating a configuration of a detector control unit.

FIG. 21 is a diagram illustrating a configuration of the detector control unit 40.

As described above, the relationship between a tilt angle and a detection solid angle in the first X-ray detector 20 and the relationship between a tilt angle and a detection solid angle in the second X-ray detector 220 are different from each other. Thus, a storage unit 440 stores a table T2 (an example of a third table) in which tilt angle information and detection solid-angle information are associated with each other in the first X-ray detector 20 and a table T6 (an example of a fourth table) in which tilt angle information and detection solid-angle information are associated with each other in the second X-ray detector 220.

The detection-solid-angle information acquisition unit 412 refers to the table T2 when acquiring the detection solid-angle information in the first X-ray detector 20 from the tilt angle information. Furthermore, the detection-solid-angle information acquisition unit 412 refers to the table T6 when acquiring the detection solid-angle information in the second X-ray detector 220 from the tilt angle information.

If the electron microscope 200 includes two kinds of specimen holder, the storage unit 440 stores four tables, which are not illustrated.

Figure 22:
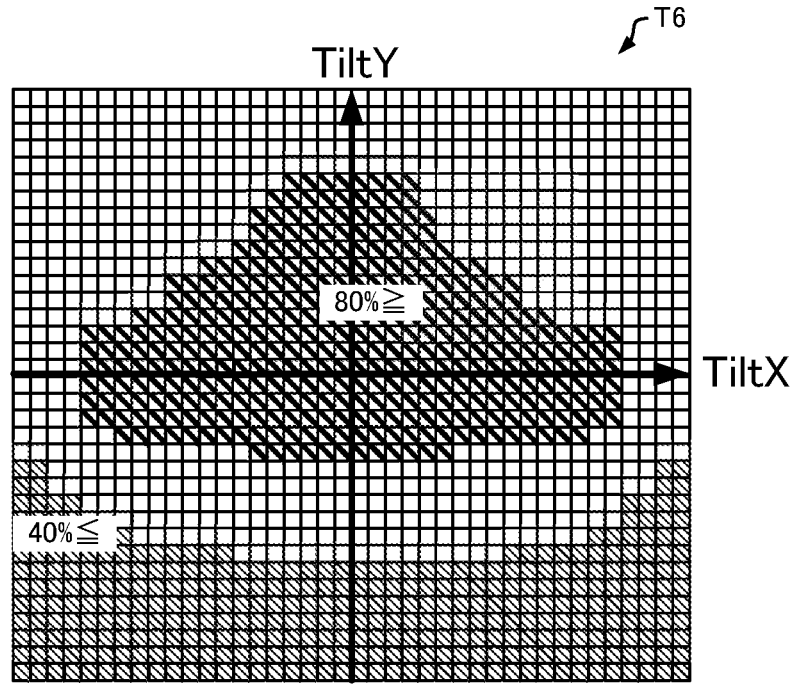
FIG. 22 illustrates a table in which tilt angle information and detection solid-angle information in a second X-ray detector are associated with each other.

FIG. 22 illustrates the table T6 in which tilt angle information and detection solid-angle information in the second X-ray detector 220 are associated with each other.

As indicated in FIG. 22, the table T6 is different from the table T2 in FIG. 5. The table T6 is created by the same method as the table T2.

A display control unit 416 causes a display unit 430 to display an image based on the detection solid-angle information of the first X-ray detector 20 and an image based on the detection solid-angle information of the second X-ray detector 220.

Figure 23:
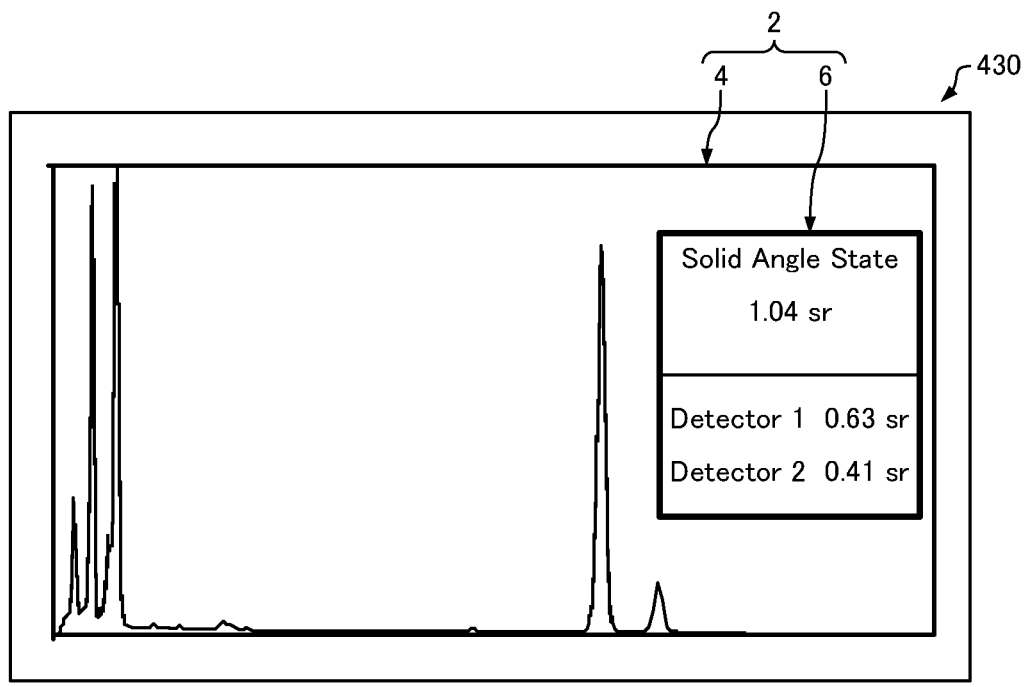
FIG. 23 schematically illustrates an analysis screen.
Figure 24:
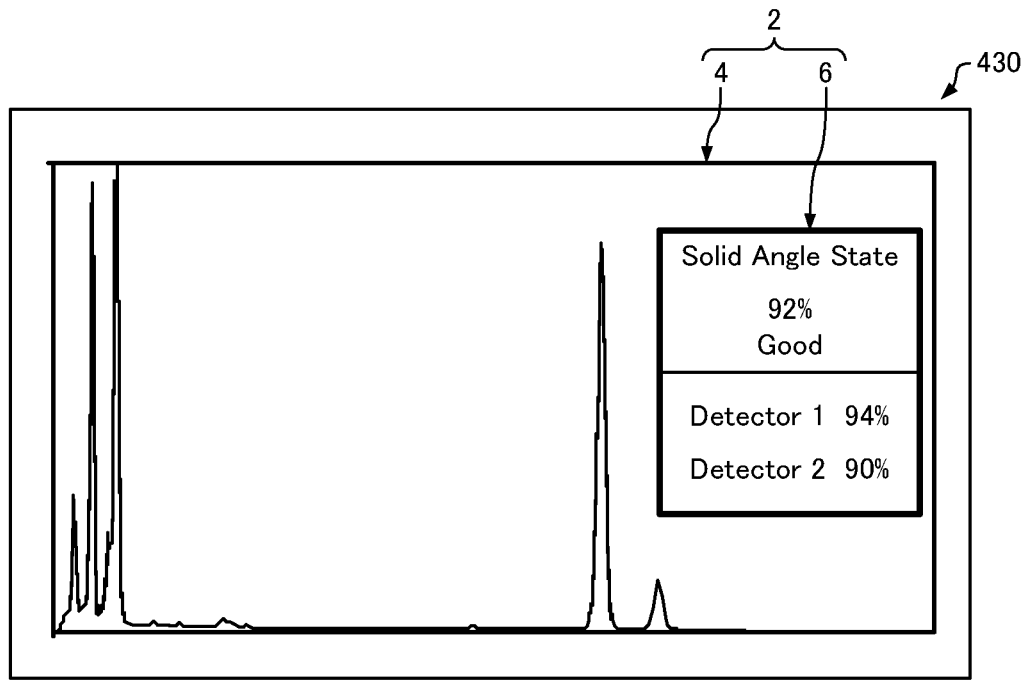
FIG. 24 schematically illustrates an analysis screen.
Figure 25:
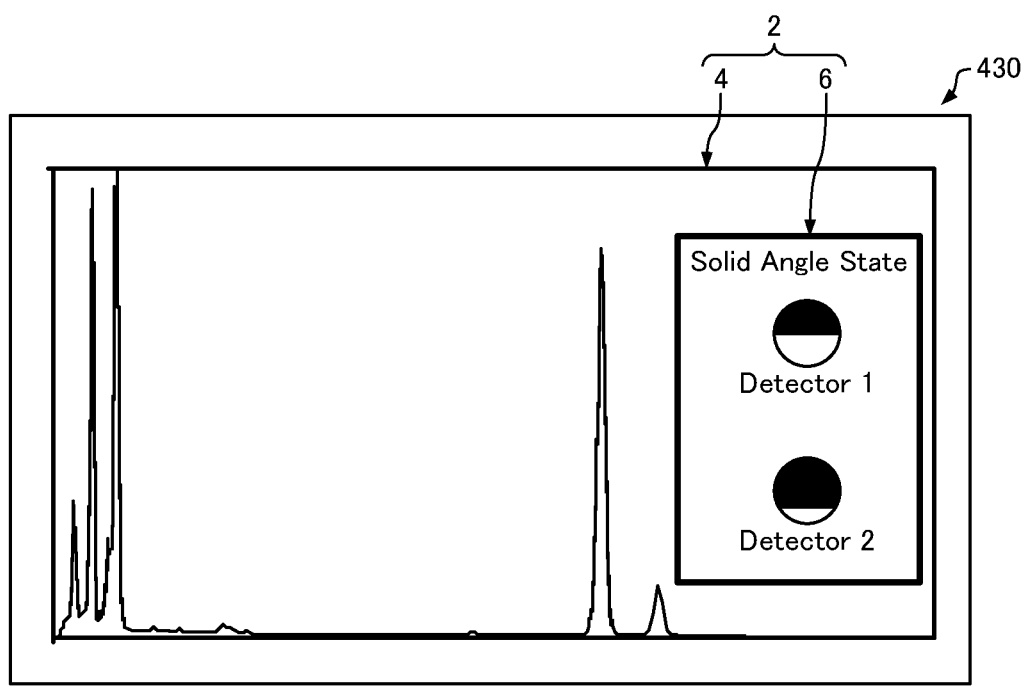
FIG. 25 schematically illustrates an analysis screen.

FIGS. 23 to 25 each schematically illustrate an analysis screen 2.

As illustrated in FIG. 23, the detection solid angle of the first X-ray detector 20, the detection solid angle of the second X-ray detector 220, and the sum of the detection solid angle of the first X-ray detector 20 and the detection solid angle of the second X-ray detector 220 may be displayed in a detection solid-angle display area 6.

As illustrated in FIG. 24, a ratio $\Omega/\Omega_{max}$ to a maximum detection solid angle in the first X-ray detector 20, a ratio $\Omega/\Omega_{max}$ to a maximum detection solid angle in the second X-ray detector 220, and the mean value of the ratio $\Omega/\Omega_{max}$ to the maximum detection solid angle in the first X-ray detector 20 and the ratio $\Omega/\Omega_{max}$ to the maximum detection solid angle in the second X-ray detector 220 may be displayed in the detection solid-angle display area 6.

As illustrated in FIG. 25, a ratio $\Omega/\Omega_{max}$ to a maximum detection solid angle in the first X-ray detector 20 and a ratio $\Omega/\Omega_{max}$ to a maximum detection solid angle in the second X-ray detector 220 may be displayed as figures or graphs in the detection solid-angle display area 6.

2.2. Operation

The display processing in the electron microscope 200 is different from the display processing in the electron microscope 100 in FIG. 7 in that in processing S106, the electron microscope 200 refers to the table T2 when acquiring the detection solid-angle information of the first X-ray detector 20 and refers to the table T6 when acquiring the detection solid-angle information of the second X-ray detector 220. Other processing is similar to the display processing in the electron microscope 100 illustrated in FIG. 7, and an explanation thereof is omitted.

2.3. Operation/Working-Effect

In the electron microscope 200, the table T2 and the table T6 are stored in the storage unit 440. Thus, in the electron microscope 200, the detection solid angle of the first X-ray detector 20 and the detection solid angle of the second X-ray detector 220 can be easily determined.

2.4. Modification

The second to fifth modifications of the first embodiment are also applicable to the second embodiment.

3. Others

The invention is not limited to the foregoing embodiments and can be modified in various ways within the scope of the invention.

For example, in the first embodiment and the second embodiment, the specimen is irradiated with an electron beam to generate an X-ray on the specimen. A charged particle beam apparatus according to the invention may generate an X-ray on a specimen by emitting a charged particle beam (e.g., an ion beam) other than an electron beam.

The charged particle beam apparatus according to the invention may include a detector for detecting electromagnetic waves other than X-rays. For example, the charged particle beam apparatus according to the invention may include a detector for detecting light (cathode luminescence) generated by irradiating a specimen with an electron beam.

The charged particle beam apparatus according to the invention may be, for example, a scanning transmission electron microscope (STEM), a scanning electron microscope (SEM), an electron probe microanalyzer (EPMA), a focused ion beam system (FIB), or a cathode luminescence microscope.

The above-described embodiments and modifications are examples and the invention is not limited thereto. For example, the embodiments and the modifications may be combined appropriately.

The invention is not limited to the above-described embodiments, and various modifications can be made. For example, the invention includes configurations that are substantially the same as the configurations described in the embodiments. Substantially same configurations means configurations having the same functions, methods and results, or configurations having the same objectives and effects as those of the configurations described in the embodiments, for example. The invention also includes configurations in which non-essential components described in the embodiments are replaced by other components. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A charged particle beam apparatus comprising:
   a tilt mechanism that tilts a specimen;
   a detector that detects an electromagnetic wave emitted from the specimen;
   a table storage unit that stores a table in which tilt angle information on a tilt angle of the specimen and detection solid-angle information on a detection solid angle of the detector are associated with each other;
   a tilt control unit that controls the tilt mechanism;
   a detection-solid-angle information acquisition unit that acquires the tilt angle information from the tilt control unit and acquires the detection solid-angle information with reference to the table; and
   a display control unit that causes a display unit to display an image based on the detection solid-angle information,
   wherein the detection solid-angle information indicates a detection solid angle as a ratio of a detection solid angle to a maximum detection solid angle obtained by the detector.

2. The charged particle beam apparatus according to claim 1, further comprising:
   an analysis-data generation unit that generates analysis data based on a detection result of the electromagnetic wave in the detector; and
   an analysis-data storage unit that stores the analysis data, wherein the analysis-data generation unit performs processing of:
   acquiring the detection solid-angle information from the detection-solid-angle information acquisition unit; and
   storing the acquired detection solid-angle information in the analysis-data storage unit in association with the analysis data.

3. A charged particle beam apparatus comprising:
a tilt mechanism that tilts a specimen;
a detector that detects an electromagnetic wave emitted from the specimen;
a table storage unit that stores a table in which tilt angle information on a tilt angle of the specimen and detection solid-angle information on a detection solid angle of the detector are associated with each other;
a tilt control unit that controls the tilt mechanism;
a detection-solid-angle information acquisition unit that acquires the tilt angle information from the tilt control unit and acquires the detection solid-angle information with reference to the table; and
a measurement time setting unit that sets a measurement time for detecting the electromagnetic wave by using the detector,
wherein the measurement time setting unit sets the measurement time based on the detection solid-angle information.

4. The charged particle beam apparatus according to claim 1, further comprising:
an input receiving unit that receives an input of the detection solid-angle information; and
a tilt-angle information acquisition unit that acquires the detection solid-angle information from the input receiving unit and acquires the tilt-angle information with reference to the table,
wherein the tilt control unit controls the tilt mechanism based on the tilt angle information.

5. A charged particle beam apparatus comprising:
a tilt mechanism that tilts a specimen;
a detector that detects an electromagnetic wave emitted from the specimen;
a table storage unit that stores a table in which tilt angle information on a tilt angle of the specimen and detection solid-angle information on a detection solid angle of the detector are associated with each other;
a tilt control unit that controls the tilt mechanism;
a detection-solid-angle information acquisition unit that acquires the tilt angle information from the tilt control unit and acquires the detection solid-angle information with reference to the table; and
a notification unit that notifies warning information when a detection solid angle indicated by the detection solid-angle information is smaller than a threshold.

6. The charged particle beam apparatus according to claim 1, further comprising an illumination-system lens that irradiates the specimen with an electron beam,
wherein the electromagnetic wave is an X-ray.

7. A charged particle beam apparatus comprising:
a tilt mechanism that tilts a specimen;
a detector that detects an electromagnetic wave emitted from the specimen;
a table storage unit that stores a table in which tilt angle information on a tilt angle of the specimen and detection solid-angle information on a detection solid angle of the detector are associated with each other;
a tilt control unit that controls the tilt mechanism;
a detection-solid-angle information acquisition unit that acquires the tilt angle information from the tilt control unit and acquires the detection solid-angle information with reference to the table;
a specimen stage including the tilt mechanism;
a first specimen holder that is attachable to the specimen stage and holds the specimen; and
a second specimen holder that is attachable to the specimen stage, holds the specimen, and has a different shape from the first specimen holder, wherein
the table storage unit stores two of the tables,
in a first table of the two tables, the tilt angle information and the detection solid-angle information in the first specimen holder are associated with each other, and
in a second table of the two tables, the tilt angle information and the detection solid-angle information in the second specimen holder are associated with each other.

8. A charged particle beam apparatus comprising:
a tilt mechanism that tilts a specimen;
a detector that detects an electromagnetic wave emitted from the specimen;
a table storage unit that stores a table in which tilt angle information on a tilt angle of the specimen and detection solid-angle information on a detection solid angle of the detector are associated with each other;
a tilt control unit that controls the tilt mechanism; and
a detection-solid-angle information acquisition unit that acquires the tilt angle information from the tilt control unit and acquires the detection solid-angle information with reference to the table, wherein
the charged particle beam apparatus comprises two of the detectors,
the table storage unit stores two of the tables,
in a first table of the two tables, the tilt angle information and the detection solid-angle information in a first detector of the two detectors are associated with each other, and
in a second table of the two tables, the tilt angle information and the detection solid-angle information in a second detector of the two detectors are associated with each other.

* * * * *